United States Patent
Daher et al.

(10) Patent No.: US 11,405,739 B2
(45) Date of Patent: Aug. 2, 2022

(54) DYNAMIC AUDIO HEADROOM MANAGEMENT SYSTEM

(71) Applicant: Bose Corporation, Framingham, MA (US)

(72) Inventors: Elie Bou Daher, Marlborough, MA (US); Cristian M. Hera, Lancaster, MA (US); Shiufun Cheung, Lexington, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 17/108,633

(22) Filed: Dec. 1, 2020

(65) Prior Publication Data
US 2022/0174442 A1     Jun. 2, 2022

(51) Int. Cl.
*H04S 7/00*     (2006.01)
*H04S 3/00*     (2006.01)

(52) U.S. Cl.
CPC ............ *H04S 7/30* (2013.01); *H04S 3/008* (2013.01); *H04S 2400/01* (2013.01); *H04S 2400/13* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,972,164 A | * | 11/1990 | Akagiri | G11B 20/00007 333/14 |
| 7,991,171 B1 | * | 8/2011 | Snow | H03G 9/005 381/102 |
| 9,967,689 B1 | * | 5/2018 | Kadri | H04R 29/007 |
| 2008/0032663 A1 | * | 2/2008 | Doyle | H04R 5/04 455/345 |
| 2009/0271185 A1 | * | 10/2009 | Smithers | H03G 11/008 704/225 |
| 2011/0002467 A1 | * | 1/2011 | Nielsen | H03G 5/165 381/17 |
| 2012/0129478 A1 | * | 5/2012 | Pierick | H03G 3/301 455/200.1 |
| 2017/0018280 A1 | * | 1/2017 | Lee | G10L 19/265 |
| 2017/0353337 A1 | * | 12/2017 | Chakraborty | H04B 1/1027 |
| 2018/0056328 A1 | * | 3/2018 | Downey | A61F 9/00745 |
| 2021/0014591 A1 | * | 1/2021 | Kim | H04S 7/30 |

FOREIGN PATENT DOCUMENTS

WO     2020/205571 A1     10/2020

\* cited by examiner

*Primary Examiner* — Duc Nguyen
*Assistant Examiner* — Assad Mohammed
(74) *Attorney, Agent, or Firm* — Brian M. Dingman; Dingman IP Law, PC

(57) ABSTRACT

In an audio system with a plurality of input signals, the input signals are prioritized from least important to most important. The level of the aggregate of all of the input signals is compared to a threshold level. If the level is greater than the threshold, the levels of one or more of the input signals are reduced one at a time, in order from the least important input signal to the most important input signal.

18 Claims, 5 Drawing Sheets ic HEADROOM
DYNAMIC AUDIO HEADROOM MANAGEMENT SYSTEM

BACKGROUND

This disclosure relates to managing audio headroom.

Audio systems, such as vehicle and automobile audio systems, may share various output transducers (e.g., loudspeakers) among multiple subsystems that implement varying features. For example, an audio system may play entertainment audio (such as occupant-selected audio like radio stations, streaming music, etc.), navigation prompts, warning audio (such as blind-spot or lane-drift warnings), incoming telephone calls, and the like. Some example vehicle systems may also generate cancelation signals intended to reduce undesired acoustic energy, such as road noise and/or engine noise, and/or may generate enhancement sounds such as engine harmonic enhancement or other sound effects. Accommodating all such audio demands through common output transducers (e.g., loudspeakers) may overload one or more loudspeakers, which may accommodate only a limited signal voltage or total power, for instance. Accordingly, there is a need to balance the available power limit (e.g., headroom) among multiple audio signals.

SUMMARY

Aspects and examples are directed to systems and methods that provide dynamic headroom management for balancing the needs of multiple audio signals or functions through one or more common output transducers, hereafter referred to as loudspeakers (but may take any of varying forms). Examples disclosed herein detect when headroom is being exhausted and may prioritize one audio signal over another by, e.g., attenuating (decreasing the amplitude) of a lower priority signal. Various examples may provide adjustment of multiple signals to balance the available headroom among any number of signals. For example, when entertainment audio demand is high (e.g., volume turned up), an anti-noise signal provided by a road noise cancellation (RNC) system may be reduced (attenuated) to avoid overdriving a loudspeaker. According to one aspect, a method of managing audio headroom is provided that includes receiving a first input signal, receiving a second input signal, combining the first and second input signals to provide a combined signal, comparing the combined signal to a threshold value, providing the combined signal as an output signal if the combined signal is less than the threshold value, providing an adjusted signal as the output signal if the combined signal is greater than the threshold value, the adjusted signal based on the combined signal, and adjusting a gain applied to at least one input signal based upon the combined signal being above the threshold value.

All examples and features mentioned below can be combined in any technically possible way.

In one aspect, a computer program product having a non-transitory computer-readable medium including computer program logic encoded thereon that, when performed on an audio system with a plurality of input signals that each have a level and are prioritized from least important to most important, and that is configured to output audio signals to at least one loudspeaker, causes the audio system to compare a level of a combination of the input signals to a threshold level, and if the level of the combination of input signals is greater than the threshold reduce the levels of one or more of the input signals one at a time, in order from the least important input signal to the most important input signal.

Some examples include one of the above and/or below features, or any combination thereof. In an example the level reduction occurs only until the combination of input signals is not greater than the threshold. In an example the combination of input signals comprises all of the input signals. In an example the level of the combination of input signals comprises a total of each input signal multiplied by its existing gain. In an example the existing gain is variable. In an example a gain applied to an input signal is reduced in order to reduce the level of the input signal.

Some examples include one of the above and/or below features, or any combination thereof. In some examples the level reduction of the one or more input signals is based on both the level of the combination of input signals and the threshold. In an example the level reduction of the one or more input signals comprises the combination of input signals divided by the threshold, minus a fixed quantity. In an example, the level reduction of the one or more input signals is no more than a predetermined amount. In an example the predetermined amount of level reduction is applied to the input signals one by one, from least important to most important, only until the level of the combination of input signals is not greater than the threshold.

Some examples include one of the above and/or below features, or any combination thereof. In some examples if the level of an input signal is not reduced, a first slowly-changing gain is increased. In an example the slowly-changing gain is provided by a dynamic headroom management control. In an example the input signal level reduction is accomplished by a limiter that is separate from the dynamic headroom management control. In an example the limiter is configured to apply a second slowly-changing gain to the input signals. In an example the input signals each have a minimum level and the sum of the minimum levels of the input signals is less than the threshold. In an example the input signals each comprise a series of sequential samples, and the comparison is accomplished on a sample by sample basis.

In another aspect a computer program product having a non-transitory computer-readable medium including computer program logic encoded thereon that, when performed on an audio system with a plurality of input signals that each have a level and are prioritized from least important to most important, and that is configured to output audio signals to at least one loudspeaker, causes the audio system to compare a level of a combination of all of the input signals to a threshold level. Each input signal has a voltage and the level of each input signal comprises its voltage modified by a slowly-changing gain. The level of the combination of input signals comprises a total of each input signal multiplied by its existing gain. The existing gain is variable. If the level of the combination of all of the input signals is greater than the threshold, the levels of one or more of the input signals are reduced one at a time, in order from the least important input signal to the most important input signal. The level reduction occurs only until the combination of input signals is not greater than the threshold. A gain applied to an input signal is reduced in order to reduce the level of the input signal. If the level of an input signal is not reduced a slowly-changing gain is increased until it reaches unity.

In another aspect a computer program product having a non-transitory computer-readable medium including computer program logic encoded thereon that, when performed on an audio system with a plurality of input signals that each have a level and are assigned a weight, and that is configured to output audio signals to at least one loudspeaker, causes the audio system to compare a level of a combination of the input signals to a threshold level, and if the level of the combination of input signals is greater than the threshold reduce the levels of all of the input signals based on their weights.

Some examples include one of the above and/or below features, or any combination thereof. In an example the weights are variable. In an example the weight variability is based on the input signals and the levels and/or the priorities of the input signals.

In another aspect a computer program product having a non-transitory computer-readable medium including computer program logic encoded thereon that, when performed on an audio system with a plurality of input signals that are prioritized from least important to most important, and that is configured to output audio signals to at least one loudspeaker, causes the audio system to compare a level of a combination of the input signals to a threshold level and if the level of the combination of input signals is greater than the threshold, reduce the level of the least important input signal while not reducing the level of at least one of the rest of the input signals.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the inventions. In the figures, identical or nearly identical components illustrated in various figures may be represented by a like reference character or numeral. For purposes of clarity, not every component may be labeled in every figure. In the figures.

DETAILED DESCRIPTION

Figure 1:
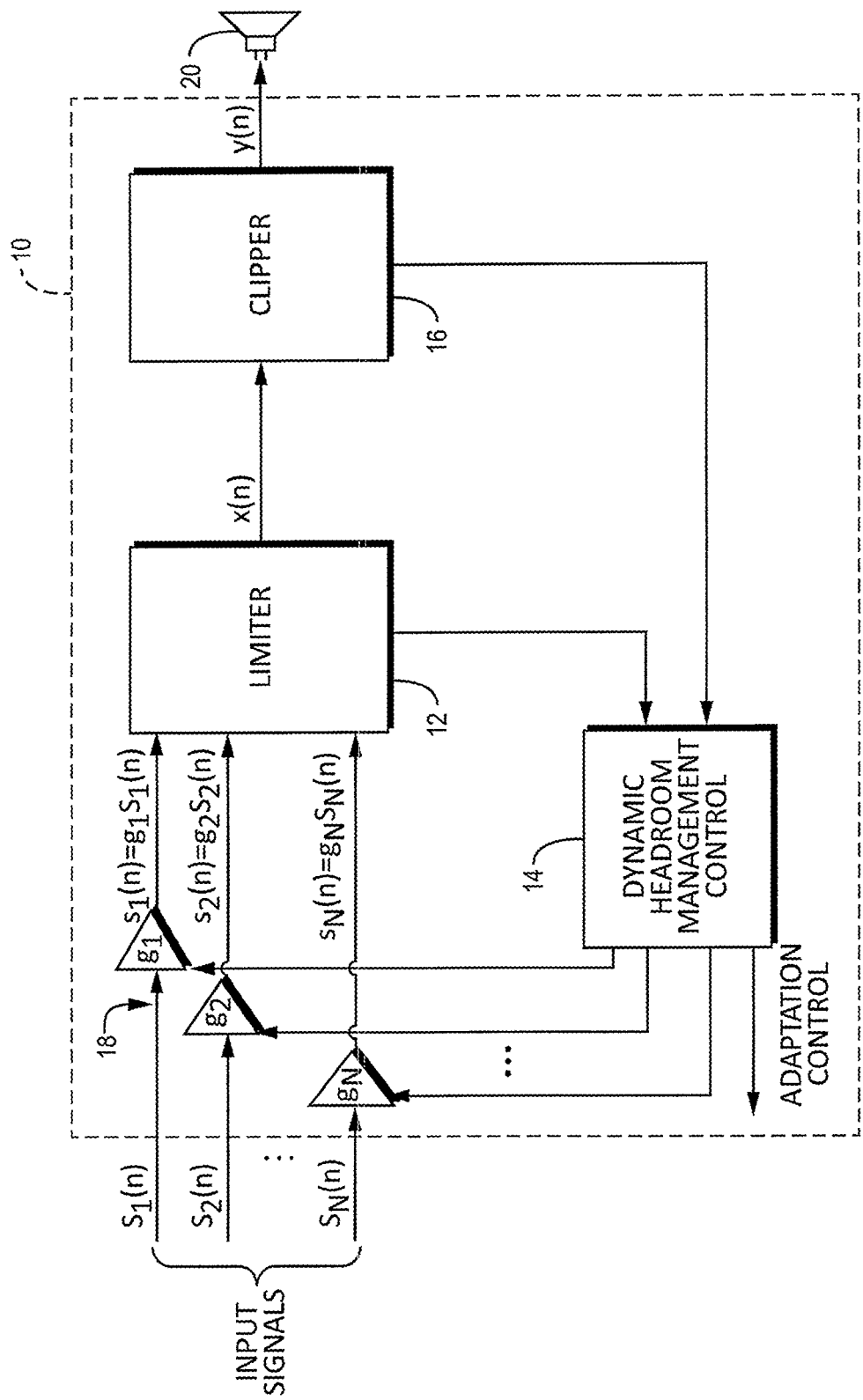
FIG. 1 is a schematic block diagram of an exemplary dynamic audio headroom management system.

Aspects of the present disclosure are directed to audio systems and methods that provide signals to one or more loudspeakers to transduce a plurality of audio signals into acoustic energy in an environment such as an occupant compartment of a vehicle. The audio systems and methods herein limit a combination of the audio signals to an available power handling capability of the loudspeakers while dynamically adjusting the audio signals to control a distribution of power allocated to the individual audio signals. Various examples include a limiter that may adjust an output signal, in some cases on a sample-by-sample basis, to help prevent a total output voltage from exceeding a voltage limit of a loudspeaker. The limiter may select one or more of the audio signals to be adjusted, and by how much, and may control a gain component to adjust the selected audio signals.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, functions, components, elements, and features discussed in connection with any one or more examples are not intended to be excluded from a similar role in any other examples.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

Also, the phraseology and terminology used herein is for the purpose of description and should not be regarded as limiting. Any references to examples, components, elements, acts, or functions of the computer program products, systems and methods herein referred to in the singular may also embrace embodiments including a plurality, and any references in plural to any example, component, element, act, or function herein may also embrace examples including only a singularity. Accordingly, references in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIG. 1 is a block diagram of a dynamic audio headroom management system 10 that manages multiple input audio signals. In an example system 10 is accomplished in the digital domain. In an example system 10 is accomplished using a processor that is part of an audio system. In a descriptive, non-limiting example the audio system is part of a motor vehicle. Alternatively the audio system can be a home or professional audio system, for example. The audio system has multiple input audio signals that are to be reproduced in the motor vehicle or other environment using one or more loudspeakers. Aspects of motor vehicle audio systems, including sources of audio signals, processing and amplification of audio signals, and provision of processed and amplified signals to the loudspeakers, are well known in the technical field and so are not further described herein. In one example the motor vehicle audio system is described in International Patent Application Number PCT/US2020/025362, published on Oct. 20, 2020 as International Publication Number WO 2020/205571, the entire disclosure of which is incorporated by reference herein for all purposes.

In some examples the audio system processor includes or is functionally coupled to digital memory that stores a computer program product having a non-transitory computer-readable medium including computer program logic encoded thereon that, when performed by the audio system processor, accomplishes some or all of the functions of system 10, FIG. 1.

$S_i(n)$, $i=1, \ldots, N$, denote the input signals. These signals can include entertainment audio, navigation prompts, phone signals, warning signals, road noise cancellation (RNC)

signals, engine harmonic cancellation (EHC) signals, and engine harmonic enhancement (EHE) signals, among others. $g_i$, i=1, ..., N, are slowly changing gains that are generated by the dynamic headroom management control function 14 in order to prevent the sum of the signals from frequently crossing the threshold of loudspeaker 20, which is representative of the one or more loudspeakers of the subject audio system. The application of the gains from dynamic headroom management control 20 are schematically depicted by the series 18 of amplifiers, although in this example the gains are applied digitally. The modified input signals $s_i(n)$ after the gains are applied are then sent to limiter 12, which acts on a sample-by-sample basis. Limiter 12, as explained in more detail below, is configured to individually reduce the level of the modified input signals, with the aim of maintaining the level of the total of all input signals it outputs to close to no more than the maximum input level of loudspeaker 20. Also as explained in more detail below, clipper 16 acts on the signal outputted by limiter 12 to ensure the signals sent to the loudspeaker does not exceed its maximum. The operations of exemplary limiter 12 and clipper 16 are further described below.

In some examples limiter 12 acts on a sample-by-sample basis on an input digital signal. In some examples limiter 12 uses the aggregate signal to detect the need for limiting, but individually attenuates the component source signals following a priority order that is pre-defined. In some examples the priority order is established by the designer of the vehicle or the audio system, such that some input signals are prioritized to be attenuated after other input signals. For example, safety-related signals such as warning signals may receive the highest priority such that they will remain at their input level unless attenuation of all of the other input signals does not bring the aggregate signal level to the threshold.

In some examples limiter 12 is configured to determine whether the level of the aggregate signal input to the limiter is above a threshold and if so, individually attenuate the input signals until the aggregate is below the threshold. Attenuation of the signals can follow a predetermined order (priority). In some examples the attenuation of input signals follows the priority, and continues until the aggregate signal level is below the threshold. In some examples signal attenuation is constrained by an attack rate, so it is possible for all the signals to be attenuated without the aggregate dropping below the threshold, in which case the system can further reduce the aggregate based on the next set of samples and continue until the threshold is reached. In some examples the signal attenuation exhibits a gradual or phased decay whereby the adjusted gains move toward a lowest gain over a series of steps taken one sample at a time, rather than a sharp one-step decay. In some examples the system compares the aggregate input signal to a threshold, but reduces gain on a signal-by-signal basis.

Since there is no guarantee that the limited signal provided to clipper 16 is in fact below the threshold, in some examples clipper 16 is configured to maintain the output that is provided to loudspeaker(s) 20 below the loudspeaker's maximum. In an embodiment clipper 16 is configured to alter the shapes of input sine waves so that their peaks are below a maximum level.

Figure 2:
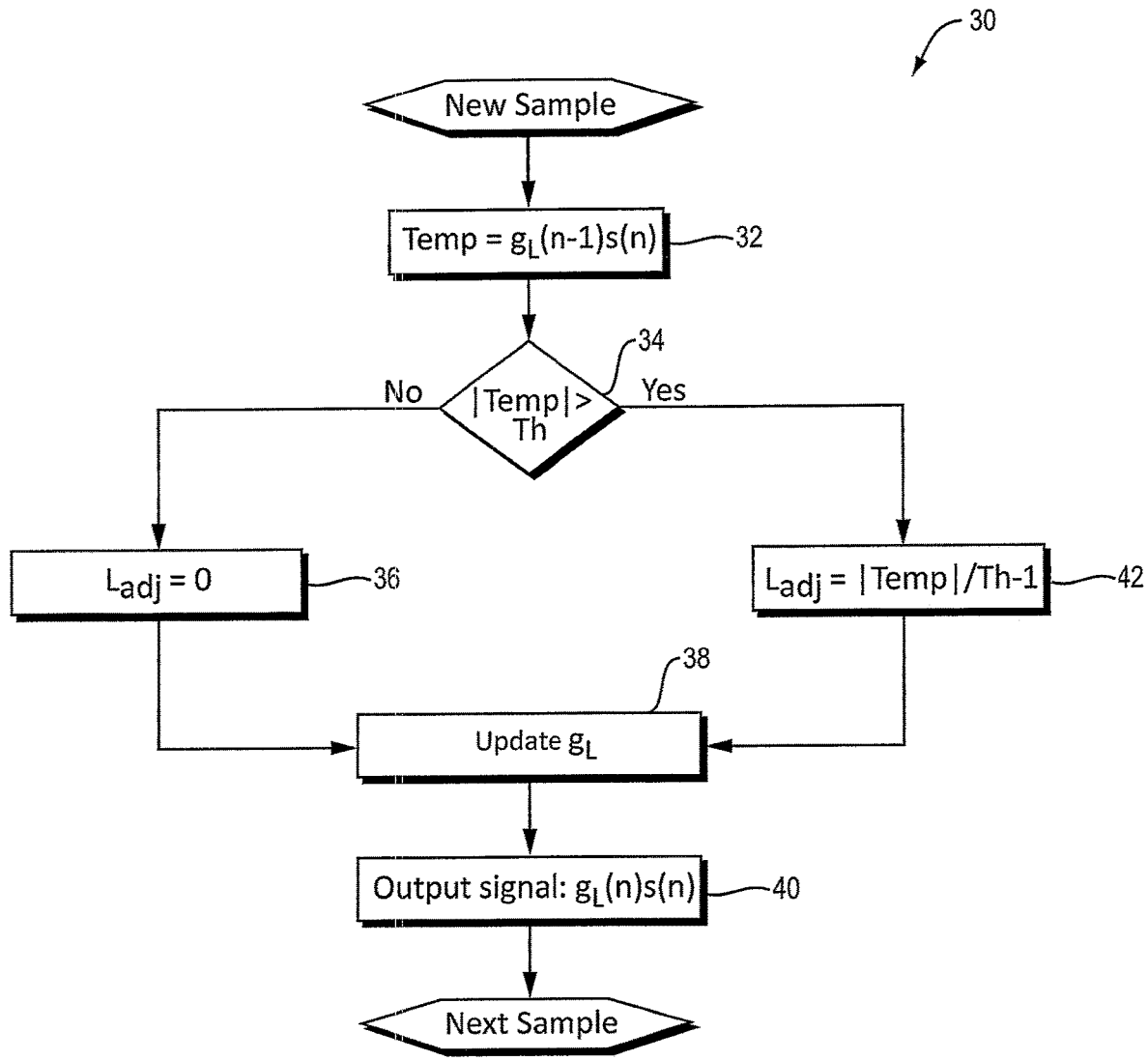
FIG. 2 is a flow diagram executable by an example limiter for use in the system of FIG. 1.

FIG. 2 is a flowchart 30 illustrating an operation of the limiter with a single input signal. In some examples, at each sample a temporary signal Temp is computed as follows (see step 32):

$$\text{Temp} = g_L(n-1) \cdot s(n), \quad (1)$$

where a $g_L(n-1)$ is the limiter gain computed at the previous sample and s(n) is the input signal at the current sample. The magnitude of the temporary signal is then compared to the limiter threshold (step 34) to compute the required level adjustment $L_{adj}$. If |Temp| is lower than the threshold, no level adjustment is required, $L_{adj}$ is set to zero (step 36) and the limiter gain $g_L$ is allowed to increase (step 38) until it reaches unity. On the other hand, if |Temp| is larger than the threshold, some level adjustment is needed to bring the aggregate signal level down below the threshold. In this case, the limiter gain $g_L$ is reduced based on the temporary signal and the threshold, step 42. The limiter gain $g_L$ is then updated based on the required level adjustment (step 38), and the output of the limiter is computed as $g_L(n) \cdot s(n)$ (step 40).

In some examples the operation of the limiter is extended to two or more input signals by summing the input signals at the input of the limiter and then effectively treating them as a single input and following the same process shown in FIG. 2. However, in this scenario, if limiting is required, all the signals would be reduced without considering their level of importance. An example of such is further described below.

In some examples, rather than reducing all the signals the limiter is configured to attenuate the gains of the signals one at a time in order from the least important to the most important, until the threshold is reached. In some examples the threshold comparison is accomplished on the aggregate signal but the attenuation is done on the separate signals; this allows prioritization and also allows the signal attenuation strategies to differ from signal to signal.

Figure 3:
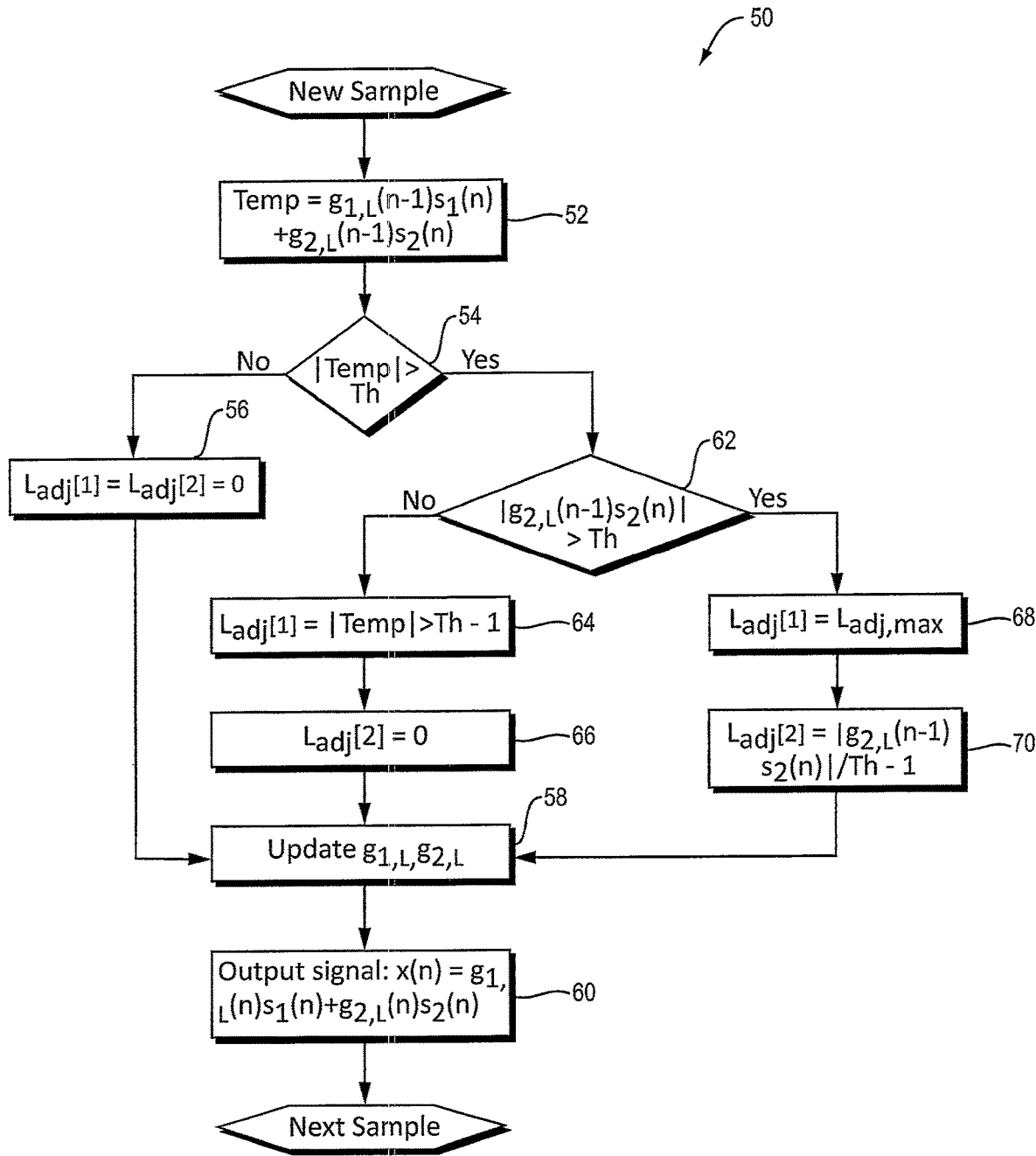
FIG. 3 is a flow diagram executable by another example limiter for use in the system of FIG. 1.

FIG. 3 is a flowchart 50 illustrating an operation of the limiter acting on two input signals, where $s_2(n)$ has a higher priority level than $s_1(n)$. This means that if possible, when limiting is needed, only $s_1(n)$ is limited and $s_2(n)$ remains unchanged.

In step 52, a temporary signal Temp is computed as follows:

$$\text{Temp} = g_{1,L}(n-1) \cdot s_1(n) + g_{2,L}(n-1) \cdot s_2(n), \quad (2)$$

where $g_{1,L}(n-1)$ and $g_{2,L}(n-1)$ are the limiter gains for $s_1$ and $s_2$ at the previous sample, respectively. The magnitude of the temporary signal is then compared to the threshold, step 54. If |Temp| is lower than the threshold, no level adjustment is needed for either signal, i.e. $L_{adj}[1]=L_{adj}[2]=0$ (step 56). On the other hand, if |Temp| is larger than the threshold, level adjustment is needed for at least one of the signals. A second check is then done on the signal with higher priority, step 62. If this signal by itself is above the limiter threshold, i.e., $|g_{2,L}(n-1) \cdot s_2(n)| > \text{Th}$, the signal with the lowest priority is reduced by the maximum allowable level ($L_{adj}[1]=L_{adj,max}$) (step 68) and the level adjustment for the signal with the highest priority is computed based on the residual, step 70. If the signal with the higher priority is not above the threshold, only the lowest priority signal needs to be attenuated, steps 64 and 66. The limiter gains for both signals are then updated using their required level adjustments (step 58) and the output of the limiter is computed (step 60) as follows:

$$x(n) = g_{1,L}(n) \cdot s_1(n) + g_{2,L}(n) \cdot s_2(n). \quad (3)$$

Figure 4:
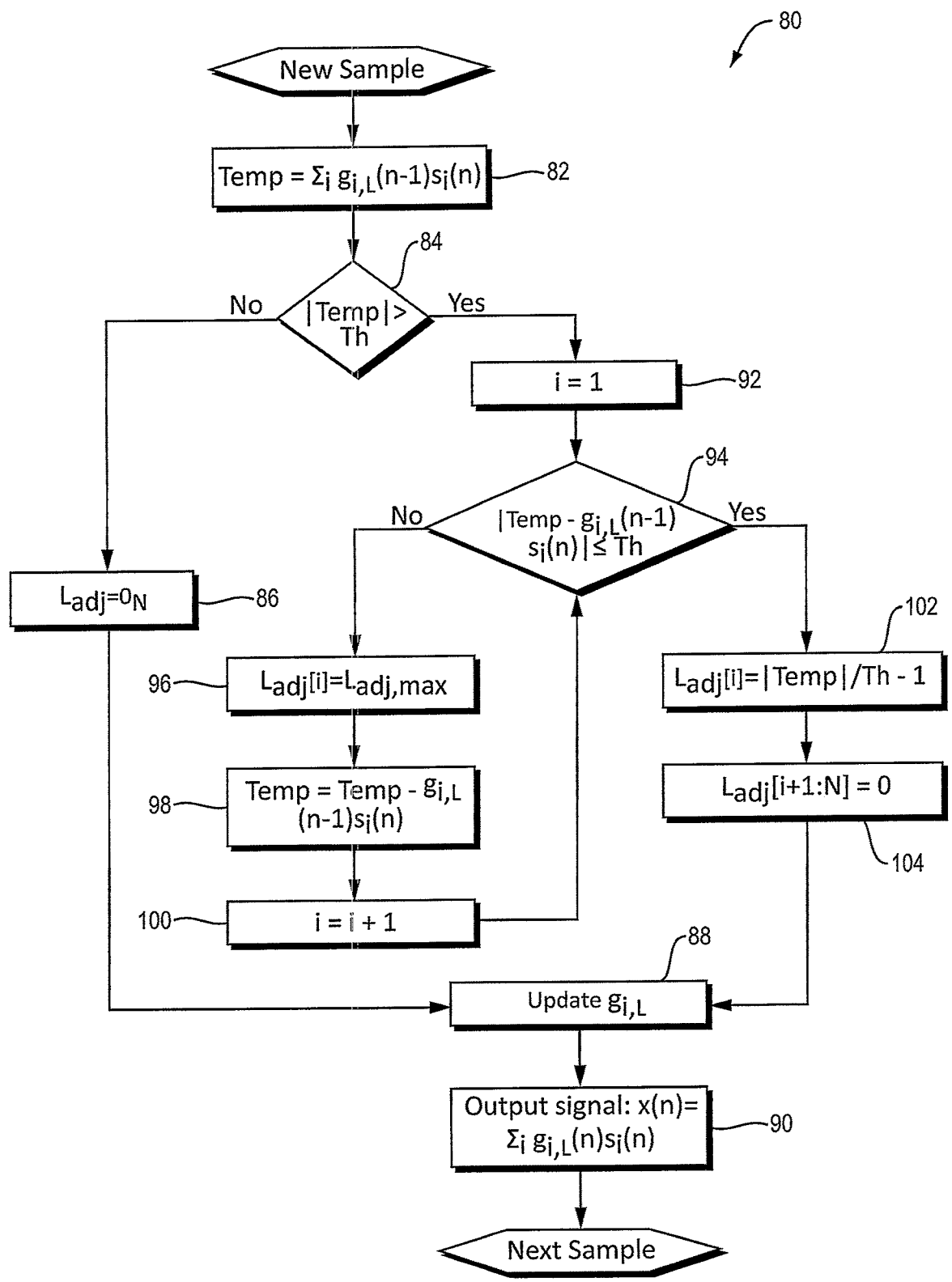
FIG. 4 is a flow diagram executable by another example limiter for use in the system of FIG. 1.

FIG. 4 is a flowchart 80 of an exemplary function of the limiter to handle an arbitrary quantity of input signals. In extending the limiter to cover multiple input signals $s_i(n)$, i=1, ..., N, each input signal $s_i(n)$ is assigned a gain $g_{i,L}$. These gains are computed based on the required level adjustment as well as the priority levels of the input signals.

In the illustrated non-limiting example the input signals are ordered in terms of reverse order of priority where $s_1(n)$ is the signal with the lowest priority and $s_N(n)$ is the signal with the highest priority. The limiter takes inputs $s_1(n), \ldots, s_N(n)$ and applies gains $g_{1,L}, \ldots, g_{N,L}$ to them, respectively.

The first step 82 is to compute a temporary signal Temp that applies the previously computed gain adjustments to the current input signals. The computation is done as follows:

$$Temp = \sum_{i=1}^{N} g_{i,L}(n-1) \cdot s_i(n). \qquad (4)$$

$g_{i,L}(n-1)$ are the limiter gain adjustments that were computed at the previous sample. The magnitude of the temporary signal is then compared to the threshold, step 84. If the magnitude is below the threshold, no level adjustment is needed for any of the signals, step 86. This can be expressed as:

$$L_{adjust} = 0_N, \qquad (5)$$

where $0_N$ is a vector of zeros of length N. On the other hand, if the magnitude of Temp is above the limiter threshold Th, at least one of the signals needs to be reduced to drop below the threshold starting with the signal with the lowest priority (i=1), step 92. For each input signal, a check is first done, step 94. The magnitude of $Temp-g_{i,L}(n-1)\cdot s_i(n)$ is compared to the threshold Th. If $|Temp-g_{i,L}(n-1)\cdot s_i(n)|$ is lower than the threshold, a new gain adjustment $g_{i,L}(n)$ can be found to push the total signal to the threshold level. The level adjustment for $s_i$ is then computed (step 102) as:

$$L_{adjust}[i] = \min\left(\max\left(\frac{|Temp|}{Th} - 1.0\right), L_{adj,max}\right). \qquad (6)$$

The remaining signals do not need a level adjustment and the rest of the loop can be skipped. This can be expressed (step 104) as:

$$L_{adjust}[i+j]=0, j=1, \ldots, N-i. \qquad (7)$$

On the other hand, $|Temp-g_{i,L}(n-1)\cdot s_i(n)|$ is still larger than the threshold, the signal $s_i$ is reduced by the maximum allowable amount ($L_{adjust}[i]=L_{adj,max}$) due to $s_i$ being the signal with the lowest priority that is left under consideration, step 96, and the Temp value is recomputed, step 98. At this stage, the index i is incremented by one (step 100), and the next signal is checked, step 94. These operations continue until the total signal level reaches the threshold.

Once all the required signals are checked and their level adjustments (gains) are computed the gain adjustments for all signals are updated, step 88, and the output of the limiter is computed, step 90, as follows:

$$x(n) = \sum_{i=1}^{N} s_{i,L}(n) = \sum_{i=1}^{N} g_{i,L}(n) \cdot s_i(n). \qquad (8)$$

In this example the input signals are sequentially reduced, starting with the signal with the lowest priority and ending with the signal with the highest priority.

In an alternative example, the gain of the input signals is reduced such that the total signal level is below a threshold signal level by assigning a weight (rather than a priority) for each signal, and reducing all signals at each sample such that the aggregate signal level is below the threshold. In this method, the total required level adjustment is computed as:

$$L_{adjust} = \frac{\left|\sum_{i=1}^{N} g_{i,L}(n-1) \cdot s_i(n)\right|}{Th} - 1. \qquad (9)$$

The level adjustment for each signal is then computed as follows:

$$L_{adjust}[i] = w_i \cdot L_{adjust}, i=1, \ldots, N, \qquad (10)$$

where $w_i$ is the weight for the ith signal with $0 < w_i \leq 1$ and $\sum_{i=1}^{N} w_i = 1$. The weights $w_i$ can be fixed, or they can be dynamically changed based on the available input signals and their levels. In some examples the weights of the different signals is based on their priority. As an illustrative example: if there are three input signals ($s_1$, $s_2$, and $s_3$), and if the weights for all the signals together add up to 1.0, and if $s_1$ and $s_2$ have the same priority and $s_3$ has double their priority. If only $s_1$ and $s_2$ are present their weights are set to $w_1=w_2=0.5$. If all three signals are present the weights would be set to: $w_1=w_2=0.25$, $w_3=0.5$.

In some examples clipper 16, FIG. 1, processes the limiter output signal before it is provided to the loudspeaker(s). The clipper can be the last stage in the processing. It is used to ensure that the loudspeaker signal is not above the threshold. In an example the clipper maintains the output below the threshold by modifying individual signals based on the aggregate signal level. As depicted in the example illustrated in FIG. 5, as the output approaches the output threshold level there can be a "soft clipping" region where the signal levels are reduced gradually rather than being hard clipped.

Figure 5:
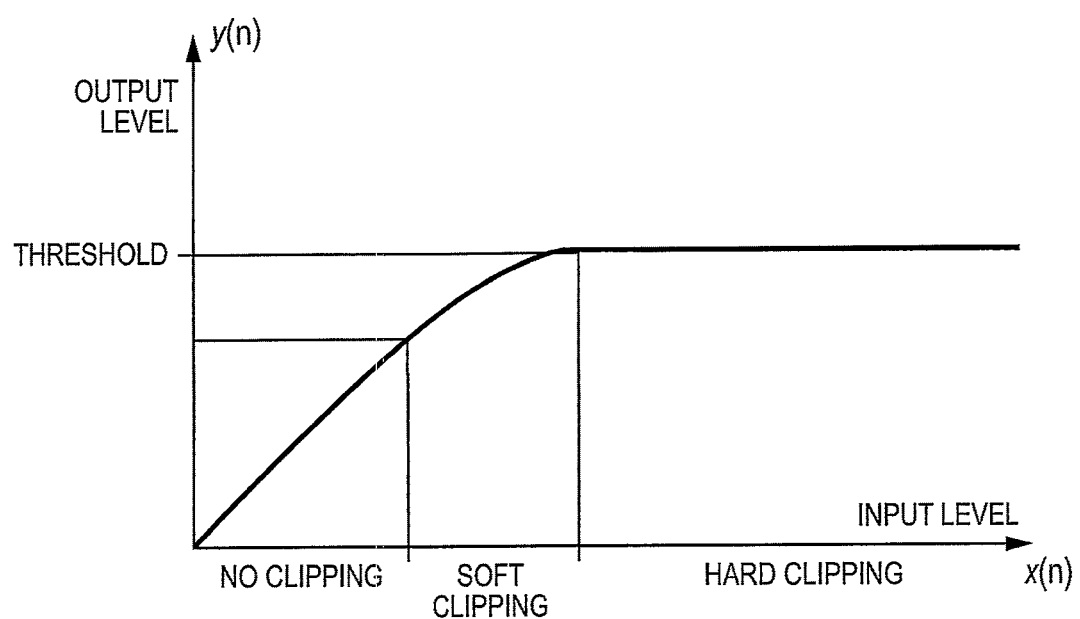
FIG. 5 illustrates a signal gain reduction accomplished by an example clipper of the system of FIG. 1.

An exemplary clipper output is depicted in FIG. 5, which illustrates dividing the clipper operation into three regions. A first region is a "no clipping" region where the output y(n) is equal to the input x(n). In this region, all input signals are passed without any adjustment. The second region is the "soft clipping" region where the output is a nonlinear function of the input. The third region is the "hard clipping" region where the output is set to the maximum threshold that can be handled by the loudspeaker. In the second and third regions, the sum of the signals is reduced to ensure that loudspeaker signal does not cross the threshold.

Similar to the limiter, the clipper can also act on the individual signals instead of acting on their sum. In this case, the clipper clips the signals starting with the signal with the lowest priority, while ensuring that the total is below the threshold.

In some examples the Dynamic Headroom Management Control block 14, FIG. 1, is used to adjust the long-term gains for the individual signals, $g_i(n)$, i=1, \ldots, N. In some examples a limiter flag and a clipper flag are assigned for each signal $S_i(n)$. The limiter and clipper flags are then passed to the dynamic headroom management control block 14. A flag hit rate is computed for each signal and the long-term gains are adjusted accordingly. A high flag hit rate means that some or all signals have high levels and need to be reduced. In some examples the long term or slow gains are adjusted to minimize the probability that the limiter and clipper are engaged in the subsequent samples. More details of long-term gain adjustment by control block 14 are disclosed in the application that is incorporated by reference herein.

Note that the previously-detailed operation for a single loudspeaker can be repeated for multiple loudspeakers, where each loudspeaker can have its own parameters, or not. In some examples the limiting and clipping are applied to each loudspeaker but the long-term gains can be common to all loudspeaker components of the same source signal.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

Functions, methods, and/or components of the methods and systems disclosed herein according to various aspects and examples may be implemented or carried out in a digital signal processor (DSP) and/or other circuitry, analog or digital, suitable for performing signal processing and other functions in accord with the aspects and examples disclosed herein. Additionally or alternatively, a microprocessor, a logic controller, logic circuits, field programmable gate array(s) (FPGA), application-specific integrated circuits) (ASIC), general computing processor(s), microcontroller(s), and the like, or any combination of these, may be suitable, and may include analog or digital circuit components and/or other components with respect to any particular implementation.

Functions and components disclosed herein may operate in the digital domain, the analog domain, or a combination of the two, and certain examples include analog-to-digital converters) (ADC) and/or digital-to-analog converter(s) (DAC) where appropriate, despite the lack of illustration of ADC's or DAC's in the various figures. Further, functions and components disclosed herein may operate in a time domain, a frequency domain, or a combination of the two, and certain examples include various forms of Fourier or similar analysis, synthesis, and/or transforms to accommodate processing in the various domains.

Any suitable hardware and/or software, including firmware and the like, may be configured to carry out or implement components of the aspects and examples disclosed herein, and various implementations of aspects and examples may include components and/or functionality in addition to those disclosed. Various implementations may include stored instructions for a digital signal processor and/or other circuitry to enable the circuitry, at least in part, to perform the functions described herein.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A computer program product having a non-transitory computer-readable medium including computer program logic encoded thereon that, when performed on an audio system with a plurality of input signals that each have a level and are prioritized from least important to most important, and that is configured to output audio signals to at least one loudspeaker, causes the audio system to:
   compare a level of a combination of the input signals to a threshold level; and
   in response to the level of the combination of input signals being greater than the threshold, reducing the levels of one or more of the input signals one at a time, in order from the least important input signal to the most important input signal, wherein the level reduction of the one or more input signals comprises the combination of input signals divided by the threshold, minus a predetermined quantity.

2. The computer program product of claim 1 wherein the level reduction occurs only until the combination of input signals is not greater than the threshold.

3. The computer program product of claim 1 wherein the combination of input signals comprises all of the input signals.

4. The computer program product of claim 1 wherein the level of the combination of input signals comprises a total of each input signal multiplied by its existing gain.

5. The computer program product of claim 4 wherein the existing gain is variable.

6. The computer program product of claim 5 wherein a gain applied to an input signal is reduced in order to reduce the level of the input signal.

7. The computer program product of claim 1 wherein the predetermined quantity comprises a fixed quantity.

8. The computer program product of claim 1 wherein the level reduction of the one or more input signals is no more than a predetermined amount.

9. The computer program product of claim 8 wherein the predetermined amount of level reduction is applied to the input signals one by one, from least important to most important, only until the level of the combination of input signals is not greater than the threshold.

10. The computer program product of claim 1 wherein when the level of an input signal is not reduced, a first slowly-changing gain is increased.

11. The computer program product of claim 10 wherein the slowly-changing gain is provided by a dynamic headroom management control.

12. The computer program product of claim 11 wherein the input signal level reduction is accomplished by a limiter that is separate from the dynamic headroom management control.

13. The computer program product of claim 12 wherein the limiter is configured to apply a second slowly-changing gain to the input signals.

14. The computer program product of claim 1 wherein the input signals each have a minimum level and the sum of the minimum levels of the input signals is less than the threshold.

15. The computer program product of claim 1 wherein the input signals each comprise a series of sequential samples, and wherein the comparison is accomplished on a sample by sample basis.

16. A computer program product having a non-transitory computer-readable medium including computer program logic encoded thereon that, when performed on an audio system with a plurality of input signals that each have a level and are prioritized from least important to most important, and that is configured to output audio signals to at least one loudspeaker, causes the audio system to:
compare a level of a combination of all of the input signals to a threshold level, wherein each input signal has a voltage and the level of each input signal comprises its voltage modified by a slowly-changing gain, wherein the level of the combination of input signals comprises a total of each input signal multiplied by its existing gain, wherein the existing gain is variable;
if the level of the combination of all of the input signals is greater than the threshold, reduce the levels of one or more of the input signals, one at a time in order from the least important input signal to the most important input signal, wherein the level reduction occurs only until the combination of input signals is not greater than the threshold, and wherein a gain applied to an input signal is reduced in order to reduce the level of the input signal; and
wherein if the level of an input signal is not reduced the slowly-changing gain is increased until it reaches unity.

17. A computer program product having a non-transitory computer-readable medium including computer program logic encoded thereon that, when performed on an audio system with a plurality of input signals that each have a level and are prioritized from least important to most important, and that is configured to output audio signals to at least one loudspeaker, causes the audio system to:
compare a level of a combination of all of the input signals to a threshold level, wherein each input signal has a voltage and the level of each input signal comprises its voltage modified by a slowly-changing gain, wherein the level of the combination of input signals comprises a total of each input signal multiplied by its existing gain, wherein the existing gain is variable;
if the level of the combination of all of the input signals is greater than the threshold, reduce the levels of one or more of the input signals, one at a time in order from the least important input signal to the most important input signal, wherein the level reduction occurs only until the combination of input signals is not greater than the threshold, and wherein a gain applied to an input signal is reduced in order to reduce the level of the input signal; and
wherein if the level of an input signal is not reduced the slowly-changing gain is increased.

18. The computer program product of claim 17 wherein if the level of an input signal is not reduced the slowly-changing gain is increased to a predetermined value.

\* \* \* \* \*